US012631674B2

(12) United States Patent　(10) Patent No.:　US 12,631,674 B2

Imhof et al.　(45) Date of Patent:　May 19, 2026

(54) ELECTROMETER SYSTEM WITH RYDBERG DECAY FLUORESCENCE DETECTION

(71) Applicant: NORTHROP GRUMMAN SYSTEMS CORPORATION, Falls Church, VA (US)

(72) Inventors: Eric A. Imhof, Albuquerque, NM (US); Steven Ryan Jefferts, Chatsworth, CA (US); Thad G. Walker, Middleton, WI (US); Vyacheslav Lebedev, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 374 days.

(21) Appl. No.: 18/349,711

(22) Filed: Jul. 10, 2023

(65) Prior Publication Data

US 2024/0019476 A1　Jan. 18, 2024

Related U.S. Application Data

(60) Provisional application No. 63/388,295, filed on Jul. 12, 2022.

(51) Int. Cl.
　G01R 29/12　(2006.01)
　B82Y 20/00　(2011.01)
(52) U.S. Cl.
　CPC ................................... G01R 29/12 (2013.01)
(58) Field of Classification Search
　CPC .... B82Y 20/00; B82Y 15/00; G01R 29/0885; G01R 29/0892
　See application file for complete search history.

(56) References Cited

U.S. PATENT DOCUMENTS 10,802,066 B1 * 10/2020 Keaveney .............. G01R 29/10
2012/0112094 A1 * 5/2012 Kao ........................ G01N 21/63
　　　　　　　　　　　　　　　　250/216

(Continued)

FOREIGN PATENT DOCUMENTS

CN　　　113376449 A　　9/2021

OTHER PUBLICATIONS

International Search Report & Written Opinion (WOISR) for corresponding PCT/US2023/027306 mailed Oct. 26, 2023.

(Continued)

*Primary Examiner* — Huy Q Phan
*Assistant Examiner* — Temilade S Rhodes-Vivour
(74) *Attorney, Agent, or Firm* — Tarolli, Sundheim, Covell & Tummino LLP

(57)　　　　　ABSTRACT

One example includes an electrometer system. The system includes a sensor cell comprising an alkali metal vapor within. The system also includes an excitation beam system configured to provide at least one excitation optical beam through the sensor cell to excite the alkali metal atoms from a ground state to a Rydberg energy state. The system also includes a stimulated emission beam system configured to provide a stimulated emission optical beam through the sensor cell to provide energy decay of the alkali metal atoms to a decay energy state that is less than the Rydberg energy state. The system further includes a detection system configured to monitor fluorescent detection light emitted from the alkali metal atoms as the alkali metal atoms decay from the decay state to the ground state to determine signal characteristics of an external signal based on an intensity of the fluorescent detection light.

22 Claims, 5 Drawing Sheets

(56) References Cited

U.S. PATENT DOCUMENTS

| 2017/0276920 A1* | 9/2017 | Frankel | G02B 21/0048 |
| 2019/0187198 A1* | 6/2019 | Anderson | G01R 29/0878 |
| 2020/0116623 A1* | 4/2020 | Cooper-Roy | G06N 10/70 |
| 2021/0049494 A1* | 2/2021 | King | G06N 20/20 |
| 2021/0389248 A1 | 12/2021 | Wetherill et al. | |
| 2022/0196718 A1 | 6/2022 | Walker et al. | |

OTHER PUBLICATIONS

AUExamReport: First Examination Report issued on Nov. 10, 2025 for AU Application No. 2023307880.

* cited by examiner

100

200

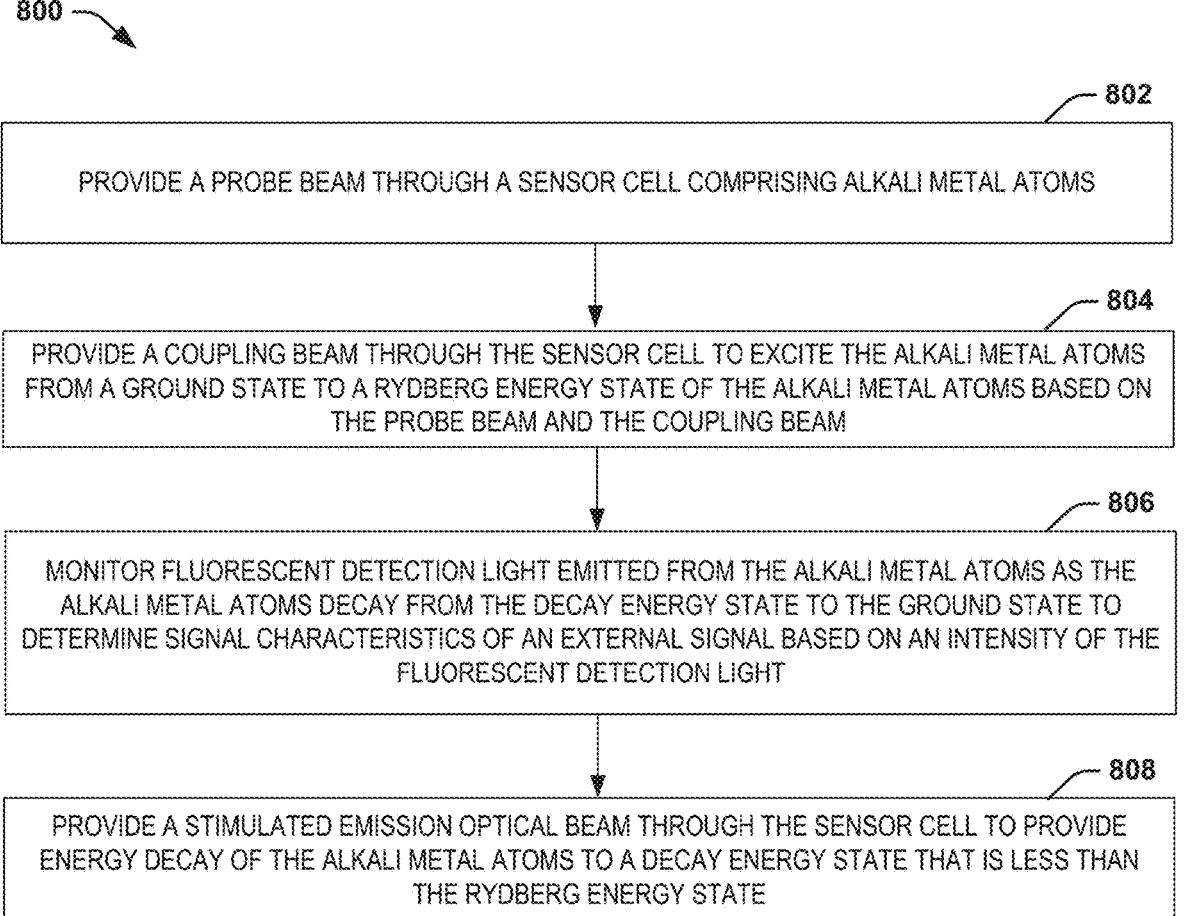

800

802
PROVIDE A PROBE BEAM THROUGH A SENSOR CELL COMPRISING ALKALI METAL ATOMS

804
PROVIDE A COUPLING BEAM THROUGH THE SENSOR CELL TO EXCITE THE ALKALI METAL ATOMS FROM A GROUND STATE TO A RYDBERG ENERGY STATE OF THE ALKALI METAL ATOMS BASED ON THE PROBE BEAM AND THE COUPLING BEAM

806
MONITOR FLUORESCENT DETECTION LIGHT EMITTED FROM THE ALKALI METAL ATOMS AS THE ALKALI METAL ATOMS DECAY FROM THE DECAY ENERGY STATE TO THE GROUND STATE TO DETERMINE SIGNAL CHARACTERISTICS OF AN EXTERNAL SIGNAL BASED ON AN INTENSITY OF THE FLUORESCENT DETECTION LIGHT

808
PROVIDE A STIMULATED EMISSION OPTICAL BEAM THROUGH THE SENSOR CELL TO PROVIDE ENERGY DECAY OF THE ALKALI METAL ATOMS TO A DECAY ENERGY STATE THAT IS LESS THAN THE RYDBERG ENERGY STATE

FIG. 8

ELECTROMETER SYSTEM WITH RYDBERG DECAY FLUORESCENCE DETECTION

RELATED APPLICATIONS

This application claims priority from U.S. Patent Application Ser. No. 63/388,295, filed 12 Jul. 2022, which is incorporated herein by reference in its entirety.

TECHNICAL FIELD

The present invention relates generally to sensor systems, and specifically to an electrometer system with Rydberg decay fluorescence detection.

BACKGROUND

Electric field measurement via electrometers has many useful applications. Detectable electric fields can include DC electric fields, as well as AC electric fields (e.g., radio frequency (RF) fields which can correspond to communications signals). The detection of electric fields can be implemented for anti-spoofing and and/or anti-jamming capability in electronic warfare environments. For example, if a jamming or spoofing signal can be detected, then the jamming signal or spoofing signal can be filtered or demodulated out to provide for a baseband signal of interest without undesired or adversarial interference. As an example, typical electrometer systems monitor absorption of photons of a probe beam that is frequency tuned to one or more energy state transitions of atoms in an alkali metal vapor. Therefore, the external electric field can affect the intensity of a detection beam corresponding to the probe beam that passes through the alkali metal vapor to determine the presence of the electric field.

SUMMARY

One example includes an electrometer system. The system includes a sensor cell comprising an alkali metal vapor within. The system also includes an excitation beam system configured to provide at least one excitation optical beam through the sensor cell to excite the alkali metal atoms from a ground state to a Rydberg energy state. The system also includes a stimulated emission beam system configured to provide a stimulated emission optical beam through the sensor cell to provide energy decay of the alkali metal atoms to a decay energy state that is less than the Rydberg energy state. The system further includes a detection system configured to monitor fluorescent detection light emitted from the alkali metal atoms as the alkali metal atoms decay from the decay state to the ground state to determine signal characteristics of an external signal based on an intensity of the fluorescent detection light.

Another example includes a method for detecting an external signal via an electrometer system. The method includes providing a probe beam through a sensor cell comprising alkali metal atoms and providing a coupling beam through the sensor cell to excite the alkali metal atoms from a ground state to a Rydberg energy state of the alkali metal atoms based on the probe beam and the coupling beam. The method also includes providing a stimulated emission optical beam through the sensor cell to provide energy decay of the alkali metal atoms to a decay energy state that is less than the Rydberg energy state. The method further includes monitoring fluorescent detection light emitted from the alkali metal atoms as the alkali metal atoms decay from the decay energy state to the ground state to determine signal characteristics of an external signal based on an intensity of the fluorescent detection light.

Another example includes an electrometer system. The system includes a sensor cell that includes alkali metal atoms within. The sensor cell includes a transparent enclosure and a reflective coating that is provided on an exterior surface of the transparent enclosure to surround the sensor cell to provide a reflective interior surface in contact with the transparent enclosure of the sensor cell. The reflective coating includes a detection window configured to facilitate escape of fluorescent detection light from the sensor cell. The system also includes an excitation beam system configured to provide at least one excitation optical beam through the sensor cell to excite the alkali metal atoms from a ground state to a Rydberg energy state, and a stimulated emission beam system configured to provide a stimulated emission optical beam through the sensor cell to provide energy decay of the alkali metal atoms to a decay energy state that is less than the Rydberg energy state. The system further includes a detection system configured to monitor the fluorescent detection light emitted from the alkali metal atoms and reflecting from the reflective interior surface within the sensor cell via the detection window as the alkali metal atoms decay from the decay energy state to the ground state to determine signal characteristics of an external signal based on an intensity of the fluorescent detection light.

BRIEF DESCRIPTION OF THE DRAWINGS

FIG. 8 illustrates an example of a method for detecting an external signal via an electrometer system.

DETAILED DESCRIPTION

Figure 1:
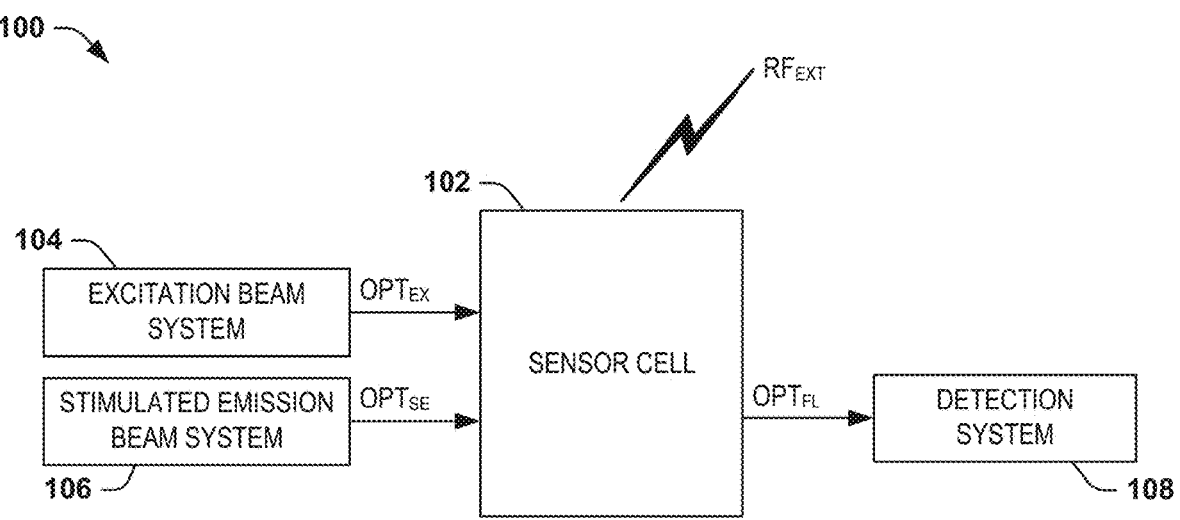
FIG. 1 illustrates an example diagram of an electrometer system.

The present invention relates generally to sensor systems, and specifically to an electrometer system with Rydberg decay fluorescence detection. The electrometer system includes a sensor cell containing a vapor of alkali metal atoms enclosed within. The electrometer system also includes an excitation beam system that is configured to provide at least one optical beam through the sensor cell to excite the alkali metal atoms from a ground state to a Rydberg energy state. As an example, the excitation beam system can include at least one probe laser and at least one coupling laser that are configured to generate probe beam(s) and coupling beam(s), respectively. Each of the probe beam(s) and the coupling beam(s) can be provided through the sensor cell via a set of optics. The probe beam(s) and coupling beam(s) can take any mutually intersecting path through the sensor cell, including but not limited to paths in which the probe beam(s) and the coupling beam(s) are arranged collinearly and anti-parallel with each other. Thus, the alkali metal atoms can absorb photons provided by the probe beam(s) to excite the alkali metal atoms from the ground state to at least one intermediate energy state between the ground state and the Rydberg energy state, and the alkali metal atoms can absorb photons provided by the coupling beam(s) to excite the alkali metal atoms from the at least one intermediate energy state to the Rydberg energy state.

The electrometer system also includes a stimulated emission beam system configured to generate a stimulated emission optical beam that is provided through the sensor cell. As an example, the stimulated emission optical beam can likewise be provided collinearly with the probe beam(s) and/or the coupling beam(s) through the sensor cell. The stimulated emission optical beam can thus stimulate decay of the alkali metal atoms, through emission of photons, from the Rydberg energy state to a decay energy state that is different from the intermediate state (e.g., any of the intermediate states that are provided to excite the alkali metal atoms from the ground state to the Rydberg energy state). Therefore, the alkali metal atoms can further decay from the decay state back to the ground state to provide fluorescent detection light. The electrometer system can further include a detection system that includes a photodetector. Therefore, the detection system can monitor the fluorescent detection light to determine a measurable parameter of an external electric field based on an intensity of the fluorescent detection light.

As an example, the sensor cell can be formed as a transparent enclosure (e.g., glass), such as a cylindrical tube having a round (e.g., circular) cross-section relative to a central longitudinal axis. The photodetector of the detection system can be located proximal to a sidewall of the sensor cell in a location that is laterally offset from a propagation direction of the stimulated emission optical beam. The stimulated emission optical beam can thus be incident on the photodetector of the detection system, such as based on being concentrated by a lens. As another example, the sensor cell can further include a reflective coating that surrounds the transparent enclosure, such that a reflective interior surface of the reflective coating is in contact with an outer surface of the transparent enclosure. Therefore, the fluorescent detection light can be reflected from the reflective interior surface within the sensor cell. The reflective coating can be absent from a portion of the transparent enclosure to provide a detection window, such that the photodetector of the detection system can be arranged proximal to the detection window. Based on the internal reflection of the fluorescent light, the reflected rays of the fluorescent detection light can also be emitted from the detection window, resulting in a larger proportion of the fluorescent light being incident on the photodetector. Furthermore, the stimulated emission optical beam can be arranged offset from and parallel to the central longitudinal axis. As a result, the rays of the fluorescent light are not retroreflected within the sensor cell, but instead continue to be reflected in the sensor cell until they are emitted from the detection window. Accordingly, the signal-to-noise-ratio (SNR) of the detection of the fluorescent detection light can be greatly improved.

By monitoring the intensity of the stimulated emission optical beam instead of a detection beam corresponding to the probe beam exiting the sensor cell, the electrometer system can detect external electric fields more accurately than a typical electrometer system. For example, in a typical electrometer system that monitors absorption of photons via a detection beam, emitted photons travel from the initial atom through the rest of the sensor cell to the detector, such that other atoms along the path could absorb that photon and block its detection. Moreover, photons can scatter (e.g., from single-photon events, reflected from the cell walls, etc.) before being provided to the photodetector, thereby introducing noise to the detection of the intensity of the detection beam by the photodetector. For these reasons, SNR at the photodetector can decrease in a typical system that monitors the detection beam corresponding to the probe beam exiting the sensor cell. By contrast, as described herein, detection of the stimulated emission optical beam is concentrated at a single wavelength to provide for greater SNR at the detection system. Specifically, because a fluorescence photon only occurs if a multi-photon transition was made, then there are no noise photons to discriminate against at the photodetector. Additionally, as described in greater detail herein, fluorescence occurs at a different wavelength than the initial multi-photon excitation, such that the fluorescence it is not absorbed in single-photon transitions, thereby allowing more signal photons to be detected.

FIG. 1 illustrates an example diagram of an electrometer system 100. The electrometer system 100 can be implemented in any of a variety of applications, such as to detect an external electromagnetic signal $RF_{EXT}$ of any frequency.

The electrometer system 100 includes a sensor cell 102 that can be configured as a sealed glass container that includes a vapor of alkali metal atoms. As an example, the alkali metal vapor can be rubidium (Rb), or any of a variety of other types of alkali metals (e.g., cesium (Cs)). As described herein, the alkali metal vapor can be excited to a Rydberg energy state, such that the alkali metal vapor can be substantially insensitive to absorption of photons of light of a specific frequency (e.g., is approximately transparent). The electrometer system 100 also includes an excitation beam system 104 that is configured to provide at least one excitation optical beam, demonstrated in the example of FIG. 1 as a beam $OPT_{EX}$, through the sensor cell 102 to excite the alkali metal atoms from a ground state to a Rydberg energy state. As an example, the excitation beam system 104 can include at least one probe laser and at least one coupling laser that are configured to generate respective probe beam(s) and coupling beam(s). The excitation beam system 104 can include optics that can provide each of the probe beam(s) and the coupling beam(s) through the sensor cell 102. For example, the probe beam(s) and coupling beam(s) can take any mutually intersecting path through the sensor cell, including but not limited to paths in which the probe beam(s) and the coupling beam(s) are arranged collinearly and anti-parallel with each other. Therefore, the alkali metal atoms can absorb photons provided by the probe beam(s) to excite the alkali metal atoms from the ground state to at least one intermediate energy state between the ground state and the Rydberg energy state, and the alkali metal atoms can absorb photons provided by the coupling beam(s) to excite the alkali metal atoms from the at least one intermediate energy state to the Rydberg energy state.

The electrometer system 100 also includes a stimulated emission beam system 106 configured to generate a stimulated emission optical beam, demonstrated in the example of FIG. 1 as a beam $OPT_{SE}$, that is provided through the sensor cell 102. The stimulated emission beam system 106 can also include a set of optics to provide the stimulated emission optical beam $OPT_{SE}$, such that the stimulated emission optical beam $OPT_{SE}$ can likewise be provided collinearly with the excitation optical beam(s) $OPT_{EX}$. As described herein, the stimulated emission optical beam $OPT_{SE}$ can stimulate decay of the alkali metal atoms in the sensor cell 102, through emission of photons, from the Rydberg energy state to a decay energy state that is different from any of the intermediate states that are provided to excite the alkali metal atoms from the ground state to the Rydberg energy state. Therefore, the alkali metal atoms can further decay from the decay state back to the ground state to provide fluorescent detection light, demonstrated in the example of FIG. 1 as an optical signal $OPT_{FL}$.

The electrometer system 100 further includes a detection system 108. The detection system 108 can include a photodetector on which the fluorescent detection light $OPT_{FL}$ can be provided. The detection system 108 can also, for example, include processing components configured to convert the intensity of the fluorescent detection light $OPT_{FL}$ to an electric signal that is indicative of the intensity of the fluorescent detection light $OPT_{FL}$. As a result, a measurable parameter of an external electric field $RF_{EXT}$, such as can affect the absorption of photons from the excitation beam(s) $OPT_{EX}$ and thereby the emission of the fluorescent detection light $OPT_{FL}$, can be measured. As an example, the photodetector of the detection system 108 can be located proximal to a sidewall of the sensor cell 102 in a location that is laterally offset from a propagation direction of the stimulated emission optical beam $OPT_{SE}$. Therefore, the fluorescent detection light $OPT_{FL}$ can be provided to the photodetector through the sidewall of the sensor cell 102. As described in greater detail herein, the sensor cell 102 can include a reflective coating and a detection window to facilitate greater signal-to-noise ratio (SNR) of the detection of the fluorescent detection light $OPT_{FL}$.

As described in greater detail herein, by monitoring the intensity of the fluorescent detection light $OPT_{FL}$, the electrometer system 100 can detect external electric fields more accurately than a typical electrometer system. For example, a typical electrometer system monitors absorption of photons via a detection beam corresponding to a probe beam exiting the sensor cell. In this manner, in a typical electrometer system, emitted photons can travel from the initial atom through the rest of the sensor cell to an associated photodetector. Therefore, other alkali metal atoms along the propagation path of the emitted photons could absorb that photon and block the photon from being detected. Moreover, photons of the associated probe beam can scatter (e.g., from single-photon events, reflected from the cell walls, etc.) before being provided to the photodetector, thereby introducing noise to the detection of the intensity of the detection beam by the photodetector. For these reasons, SNR at the photodetector can decrease in a typical system. However, as described herein, detection of the fluorescent detection light $OPT_{FL}$ is concentrated at a single wavelength to provide for greater SNR at the detection system. Particularly, because a fluorescence photon only occurs if a multi-photon transition occurs, then there are no noise photons to discriminate against at the photodetector of the detection system 108. Additionally, as described in greater detail herein, fluorescence occurs at a different wavelength than the initial multi-photon excitation, such that the fluorescence it is not absorbed in single-photon transitions. Accordingly, more signal photons can be detected by the detection system 108.

Figure 2:
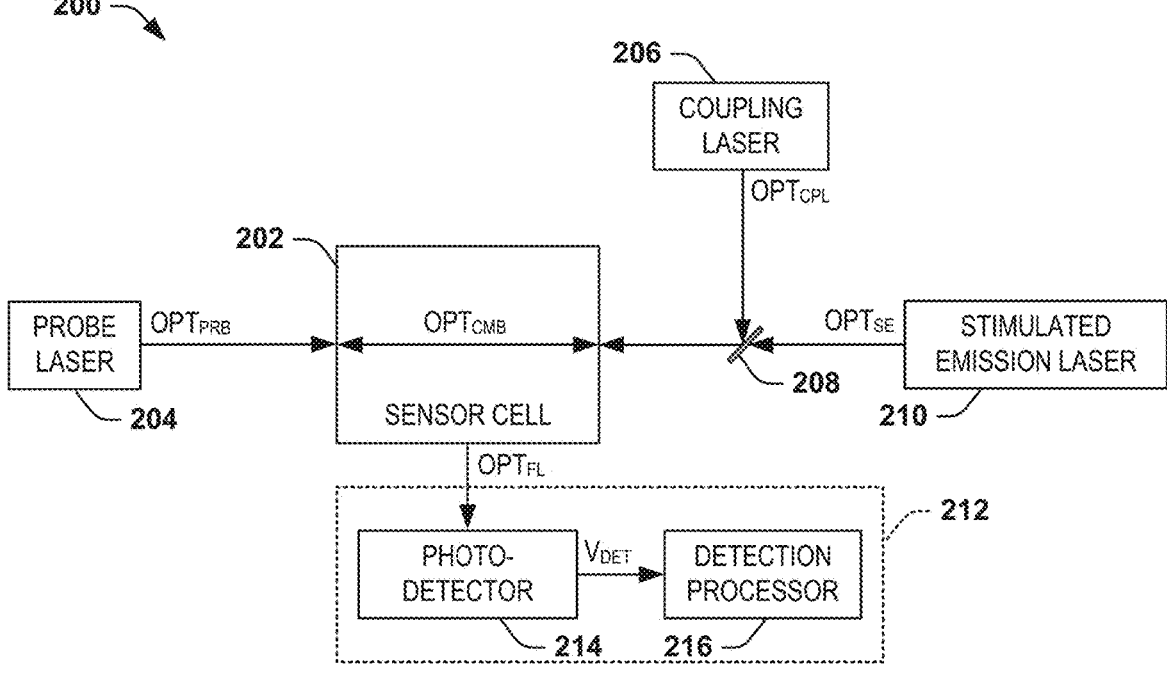
FIG. 2 illustrates another example diagram of an electrometer system.

FIG. 2 illustrates another example diagram of an electrometer system 200. The electrometer system 200 can be implemented in any of a variety of applications, such as to determine a source of an external signal (e.g., in an electronic warfare environment). The electrometer system 200 can correspond to the electrometer system 100 in the example of FIG. 1. Therefore, reference is to be made to the example of FIG. 1 in the following description of the example of FIG. 2.

The electrometer system 200 includes a sensor cell 202 that can be configured as a sealed glass container that includes an alkali metal vapor. The electrometer system 200 also includes a probe laser 204 that is configured to generate a probe beam $OPT_{PRB}$ and a coupling laser 206 that is configured to generate a coupling beam $OPT_{CPL}$. The probe beam $OPT_{PRB}$ and the coupling beam $OPT_{CPL}$ can collectively correspond to the at least one excitation beam $OPT_{EX}$ in the example of FIG. 1. The probe beam $OPT_{PRB}$ is provided through the sensor cell 202 in a first direction. In the example of FIG. 2, the coupling beam $OPT_{CPL}$ is provided to a beam splitter 208 (e.g., polarization beam splitter) that is configured to reflect the coupling beam $OPT_{CPL}$ into the sensor cell 202 and to pass the probe beam $OPT_{PRB}$, such that the probe beam $OPT_{PRB}$ and the coupling beam $OPT_{CPL}$ can propagate collinearly and antiparallel with respect to each other through the sensor cell 202. As described in greater detail herein, the probe beam $OPT_{PRB}$ and the coupling beam $OPT_{CPL}$ can be tuned to respective frequencies to provide the Rydberg transition of the alkali metal vapor.

The electrometer system 200 also includes a stimulated emission laser 210 that is configured to generate a stimulated emission optical beam $OPT_{SE}$. In the example of FIG. 2, the stimulated emission optical beam $OPT_{SE}$ is provided through the beam splitter 208 to likewise be provide collinearly with the probe beam $OPT_{PRB}$ and the coupling beam $OPT_{CPL}$, such that the combination of the probe beam $OPT_{PRB}$, the coupling beam $OPT_{CPL}$, and the stimulated emission optical beam $OPT_{SE}$ is demonstrated in the example of FIG. 2 as a beam $OPT_{CMB}$ in the sensor cell 202. The arrangement of the optics and the manner in which the probe beam $OPT_{PRB}$, the coupling beam $OPT_{CPL}$, and the stimulated emission optical beam $OPT_{SE}$ are provided through the sensor cell 202 is demonstrated merely by example, such that any of a variety of ways of providing the probe beam $OPT_{PRB}$, the coupling beam $OPT_{CPL}$, and the stimulated emission optical beam $OPT_{SE}$ through the sensor cell 202 can be implemented in the electrometer system 200.

As described above, the probe beam $OPT_{PRB}$ and the coupling beam $OPT_{CPL}$ can be tuned to respective frequencies to provide the Rydberg transition of the alkali metal vapor. As an example, the probe beam $OPT_{PRB}$ can have a frequency that is configured to excite the alkali metal vapor from a ground state to an intermediate state, and the coupling beam $OPT_{CPL}$ can have a frequency that is configured to excite the alkali metal atoms from the intermediate state to a Rydberg energy state. The Rydberg energy state can thus correspond to a state in which the alkali metal atoms are substantially insensitive to the frequency of the probe beam $OPT_{PRB}$, such as to facilitate detection of an external electric field. While the example of FIG. 2 demonstrates a single coupling beam $OPT_{CPL}$, additional coupling beams can be implemented to provide for additional intermediate energy states between the ground state and the Rydberg energy state, as described in greater detail herein. Additionally, as another example, the electrometer system 200 can include one or more radio frequency (RF) signal generators (not shown) configured to provide RF signals of a predetermined frequency through the sensor cell 202, such as to tune the alkali metal atoms to a further Rydberg state and/or to provide Autler Townes frequency-spectrum transparency peaks of the alkali metal atoms. Such techniques can be implemented to detect one or more measurable parameters (e.g., frequency, direction, etc.) of an external electric field.

Figure 3:
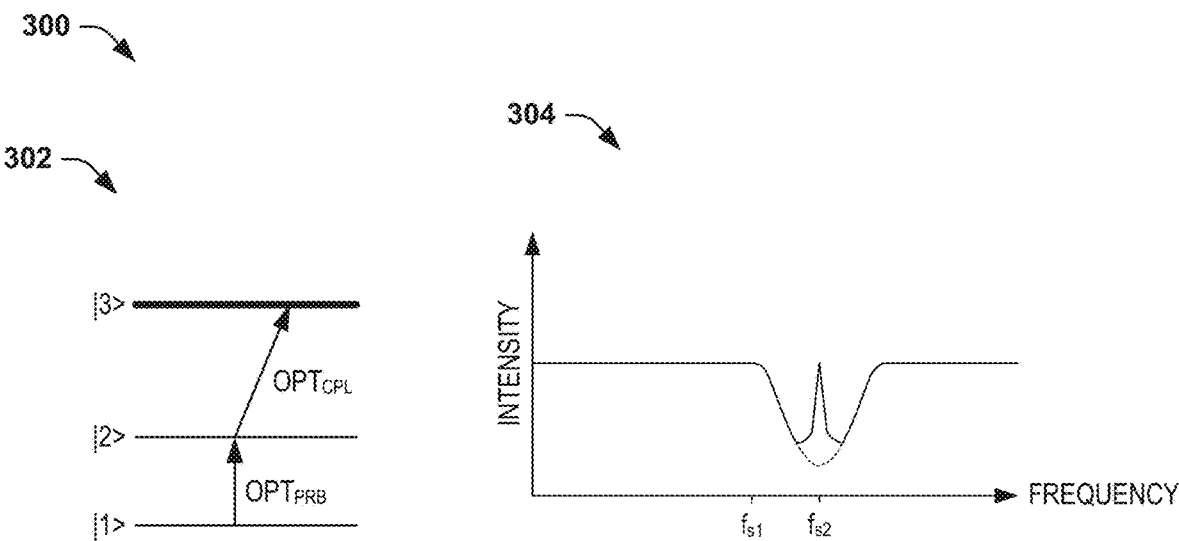
FIG. 3 illustrates an example diagram of optical detection.

FIG. 3 illustrates an example diagram 300 of optical detection. The diagram 300 includes an energy state diagram 302 and a graph 304 that demonstrates intensity of the probe beam $OPT_{PRB}$ exiting the sensor cell 202, plotted as a function of frequency. Therefore, reference is to be made to the example of FIG. 2 in the following description of the example of FIG. 3.

The energy state diagram 302 demonstrates a first energy state (e.g., ground state)|1> at which the alkali metal atoms can begin. As an example, the ground state |1> for rubidium atoms can be |5S$_{1/2}$>. In response to the probe beam $OPT_{PRB}$, a population of the alkali metal atoms can be excited to an intermediate energy state |2>. As an example, the intermediate energy state |2> for rubidium atoms can be |5P$_{3/2}$> based on an example wavelength of approximately 780 nanometers for the probe beam $OPT_{PRB}$. In response to the coupling beam $OPT_{CPL}$, a population of the excited alkali metal atoms can be further excited to a Rydberg energy state |3>. Therefore, the alkali metal atoms in the Rydberg energy state |3> can be transparent with respect to light at the approximate frequency of the probe beam $OPT_{PRB}$.

The graph 304 plots an intensity of the detection beam $OPT_{DET}$ as a function of frequency. In the example of FIG. 3, the graph 304 demonstrates an intensity of approximately 100% of the intensity of the probe beam $OPT_{PRB}$, and thus substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the probe beam $OPT_{PRB}$. The minimum intensity is demonstrated at an inverse peak dotted line in the example of FIG. 3, which would correspond to maximum absorption of the photons of the probe beam $OPT_{PRB}$ absent the coupling beam $OPT_{CPL}$. However, based on the interaction of the alkali metal vapor with the probe beam $OPT_{PRB}$ and the coupling beam $OPT_{CPL}$, the alkali metal vapor can exhibit a transition from the intermediate energy state |2> and the Rydberg energy state |3>. Therefore, the alkali metal vapor can be substantially insensitive to absorption of the photons of the probe beam $OPT_{PRB}$ at the frequency $f_{s2}$ that would otherwise correspond to the maximum absorption frequency $f_{s2}$ on the frequency spectrum absent the coupling beam $OPT_{CPL}$.

Referring back to the example of FIG. 2, the detection of the measurable parameters of the external electric field can be based on a determination of absorption of photons of the probe beam $OPT_{PRB}$ and the coupling beam $OPT_{CPL}$ by the alkali metal atoms in the sensor cell 202. In a typical electrometer system, the intensity of the probe beam $OPT_{PRB}$ exiting the sensor cell would be measured as a detection beam. However, by monitoring the intensity of such a detection beam in a typical electrometer system, emitted photons can travel from the initial atom through the rest of the sensor cell to an associated photodetector, enabling other alkali metal atoms along the propagation path of the emitted photons to absorb the photon and block the photon from being detected. Such a detection method by a typical electrometer system can also introduce noise based on the scattering of photons of the associated probe beam, such as from single-photon events or reflection from the sensor cell walls, before being provided to the photodetector. Thus, monitoring a detection beam corresponding to the probe beam exiting the sensor cell can result in a decrease in SNR.

In the example of FIG. 2, to determine the absorption of the photons of the probe beam $OPT_{PRB}$ and the coupling beam $OPT_{CPL}$ by the alkali metal atoms in the sensor cell 202, the stimulated emission optical beam $OPT_{SE}$ can be frequency tuned to an energy difference between the Rydberg energy state and a decay energy state. The decay energy state can be different from the intermediate state(s) to which the alkali metal atoms are excited between the ground state and the Rydberg energy state. Therefore, the stimulated emission optical beam $OPT_{SE}$ can stimulate emission of photons from the alkali metal atoms to force an energy decay of a population of the alkali metal atoms from the Rydberg energy state to the decay energy state. The alkali metal atoms can thus naturally decay from the decay energy state back to the ground state, thereby emitting fluorescence photons at a wavelength corresponding to the energy difference between the decay energy state and the ground state. The fluorescence photons can thus correspond to the fluorescent detection light $OPT_{FL}$. The fluorescent detection light $OPT_{FL}$ can thus be monitored to determine the measurable parameters of the external electric field. As an example, the intensity of the fluorescent detection light $OPT_{FL}$ can be measured, which can correspond to a frequency shift of absorption spectrum corresponding to the presence of an external electric field.

Figure 4:
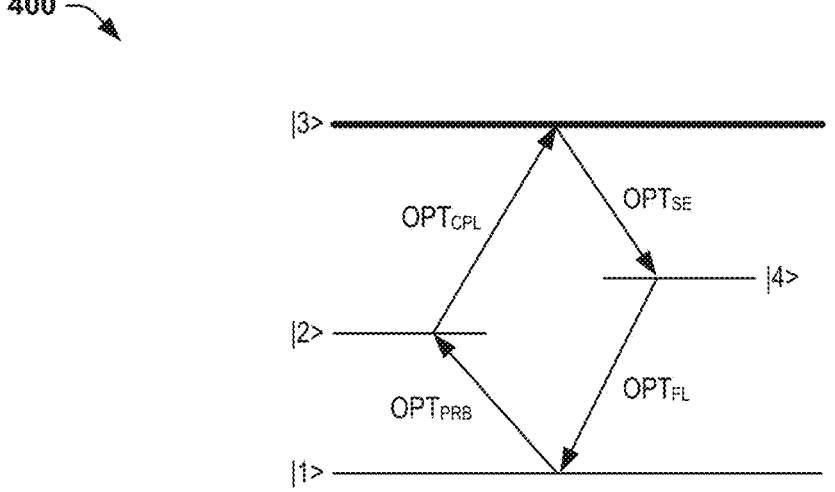
FIG. 4 illustrates an example diagram of energy state transitions.
Figure 5:
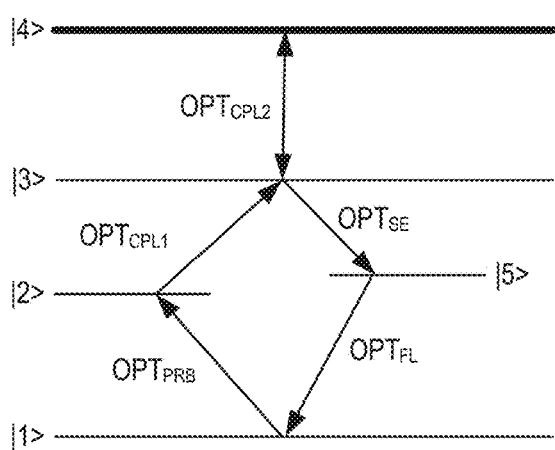
FIG. 5 illustrates another example diagram of energy state transitions.

FIGS. 4 and 5 illustrate example diagrams of energy state transitions. The example of FIG. 4 includes a first energy state transition diagram 400 and the example of FIG. 5 illustrates an example of a second energy state transition diagram 500. The diagrams 400 and 500 can correspond to energy state transitions described with reference to the examples of FIGS. 1 and 2. Therefore, reference is to be made to the examples of FIGS. 1 and 2 in the following description of the example of FIGS. 4 and 5.

In the example of FIG. 4, the first energy state transition diagram 400 demonstrates a first energy state (e.g., ground state) |1> at which the alkali metal atoms can begin. In response to the probe beam $OPT_{PRB}$, a population of the alkali metal atoms can be excited to an intermediate energy state |2>. In response to the coupling beam $OPT_{CPL}$, a population of the excited alkali metal atoms can be further excited to a Rydberg energy state |3>.

In the first energy state transition diagram 400, to facilitate detection of the fluorescent detection light $OPT_{FL}$, as described above, the stimulated emission optical beam $OPT_{SE}$ is frequency tuned to a difference between the Rydberg energy state |3> and a decay energy state |4>. As demonstrated in the example of FIG. 4, the decay energy state |4> corresponds to an energy state that is different from the intermediate energy state |2>. Therefore, the stimulated emission optical beam $OPT_{SE}$ stimulates emission of photons from the alkali metal atoms to decay the energy of the alkali metal atoms from the Rydberg energy state |3> to the decay energy state |4>. The alkali metal atoms thus naturally decay from the decay energy state |4> back to the ground state |1>, thereby emitting the fluorescent detection light $OPT_{FL}$. Because the decay energy state |4> is different from the intermediate energy state |2>, the fluorescent detection light $OPT_{FL}$ has a distinct wavelength that can be monitored.

As described above in the example of FIG. 2, the electrometer system 200 can include at least one additional coupling laser to generate respective coupling beams to provide for additional intermediate energy states between the ground state and the Rydberg energy state. In the example of FIG. 5, the second energy state transition diagram 500 demonstrates a first energy state (e.g., ground state)|1> at which the alkali metal atoms can begin. In response to the probe beam $OPT_{PRB}$, a population of the alkali metal atoms can be excited to a first intermediate energy state |2>. In response to a first coupling beam $OPT_{CPL1}$ provided by a first coupling laser, a population of the excited alkali metal atoms can be excited to a second intermediate energy state |3>. In response to a second coupling beam $OPT_{CPL2}$ provided by a second coupling laser, a population of the excited alkali metal atoms can be further excited to the Rydberg energy state |4>.

In the second energy state transition diagram 500, a portion of the population of the alkali metal atoms that were excited from the second intermediate energy state |3> to the Rydberg energy state |4> can naturally fall back to the second intermediate energy state |3>. To facilitate detection of the fluorescent detection light $OPT_{FL}$, as described above, the stimulated emission optical beam $OPT_{SE}$ is frequency tuned to a difference between the second intermediate energy state |3> and a decay energy state |5>. As demonstrated in the example of FIG. 4, the decay energy state |5> corresponds to an energy state that is different from the first and second intermediate energy states |2> and |3>. Therefore, the stimulated emission optical beam $OPT_{SE}$ stimulates emission of photons from the alkali metal atoms to decay the energy of the alkali metal atoms from the second intermediate energy state |3> to the decay energy state |5>. The alkali metal atoms thus naturally decay from the decay energy state |5> back to the ground state |1>, thereby emitting the fluorescent detection light $OPT_{FL}$. Because the decay energy state |5> is different from the first and second intermediate energy states |2> and |3>, the fluorescent detection light $OPT_{FL}$ has a distinct wavelength that can be monitored.

Referring back to the example of FIG. 2, the electrometer system 200 further includes a detection system 212. In the example of FIG. 2, the detection system 212 includes a photodetector 214 (e.g., a photodiode) and a detection processor 216. The photodetector 214 can monitor the intensity of the fluorescent detection light $OPT_{FL}$ and generate an electric signal, demonstrated in the example of FIG. 2 as a voltage $V_{DET}$ that corresponds to the intensity of the fluorescent detection light $OPT_{FL}$. The detection processor 216 can thus calculate the characteristics of the external signal based on the voltage $V_{DET}$, and thus based on the intensity of the $OPT_{FL}$ corresponding to the changes in absorption of the probe beam $OPT_{PRB}$ and coupling beam(s) $OPT_{CPL}$ by the alkali metal vapor resulting from the external electric field.

In the example of FIG. 2, the photodetector 214 of the detection system 212 can be located proximal to a sidewall of the sensor cell 202 in a location that is laterally offset from a propagation direction of the stimulated emission optical beam $OPT_{SE}$. Therefore, the fluorescent detection light $OPT_{FL}$ can be provided to the photodetector through the sidewall of the sensor cell 202. Based on the distinct wavelength of the fluorescent detection light $OPT_{FL}$, detection of the fluorescent detection light $OPT_{FL}$ can provide for greater SNR at the photodetector 214. Particularly, because a fluorescence photon is only emitted when a multi-photon transition occurs, then there are no noise photons to discriminate against at the photodetector 214, and the fluorescence it is not absorbed in single-photon transitions. Accordingly, more signal photons can be detected by the photodetector 214. As further described herein, the sensor cell 202 can include a reflective coating and a detection window to facilitate even greater SNR of the detection of the fluorescent detection light $OPT_{FL}$.

Figure 6:
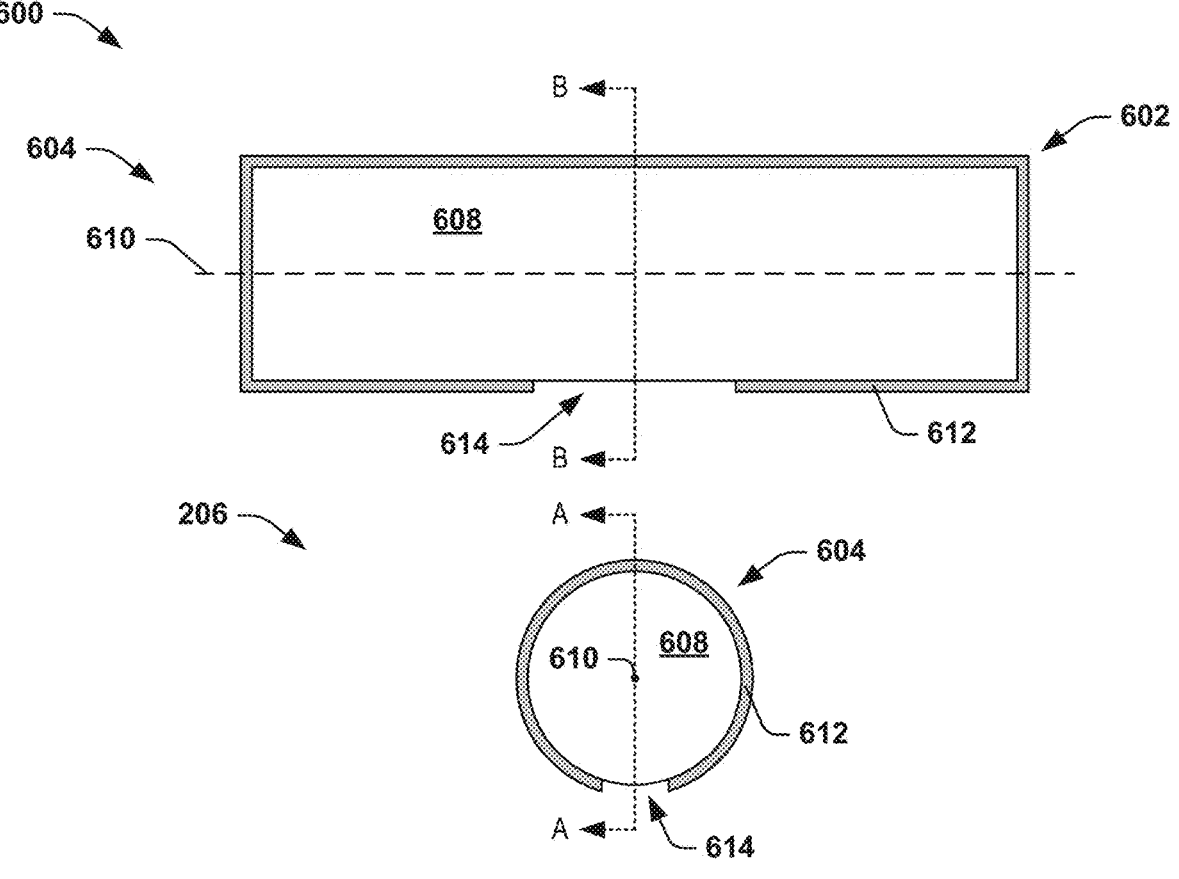
FIG. 6 illustrates an example diagram of a sensor cell.

FIG. 6 illustrates an example diagram 600 of a sensor cell 602. The sensor cell 602 is demonstrated in a first view 604 corresponding to a cross-sectional view taken along "A", and in a second view 606 corresponding to a cross-sectional view taken along "B". The sensor cell 602 can correspond to the sensor cell 202 in the example of FIG. 2. Therefore, reference is to be made to the example of FIG. 2 in the following description of the example of FIG. 6.

The sensor cell 602 includes a transparent enclosure 608 that can be formed from a variety of transparent materials (e.g., glass). In the example of FIG. 6, the transparent enclosure 608 is arranged as a cylindrical tube having a circular cross-section relative to a central longitudinal axis 610. The sensor cell 602 includes a reflective coating 612 that surrounds the transparent enclosure 608. As an example, the reflective coating 612 can be formed from a dielectric material that can be substantially transparent with respect to the frequency of the probe beam $OPT_{PRB}$, the coupling beam $OPT_{CPL}$, and the stimulated emission optical beam $OPT_{SE}$, but can be highly reflective with respect to the fluorescent detection light $OPT_{FL}$. The reflective coating 612 can thus provide a highly reflective interior surface in contact with an outer surface of the transparent enclosure 608. As a result of the highly reflective interior surface of the reflective coating 612, the fluorescent detection light $OPT_{FL}$ resulting from the energy decay of the alkali metal atoms can be reflected within the sensor cell 602, as opposed to being transmissive through the transparent walls of the transparent enclosure 608.

The sensor cell 602 further includes a detection window 614 corresponding to an absence of the reflective coating 612 from a portion of the transparent enclosure 608. Therefore, the detection window 614 corresponds to an aperture through which the fluorescent detection light $OPT_{FL}$ can propagate through the transparent enclosure 608 to escape the sensor cell 602. In the example of FIG. 6, the detection window 614 is demonstrated on a lateral side of the sensor cell 602, approximately centered on a midpoint of the length of the sensor cell 602. However, other locations and sizes of the detection window 614 are possible, as described herein.

Figure 7:
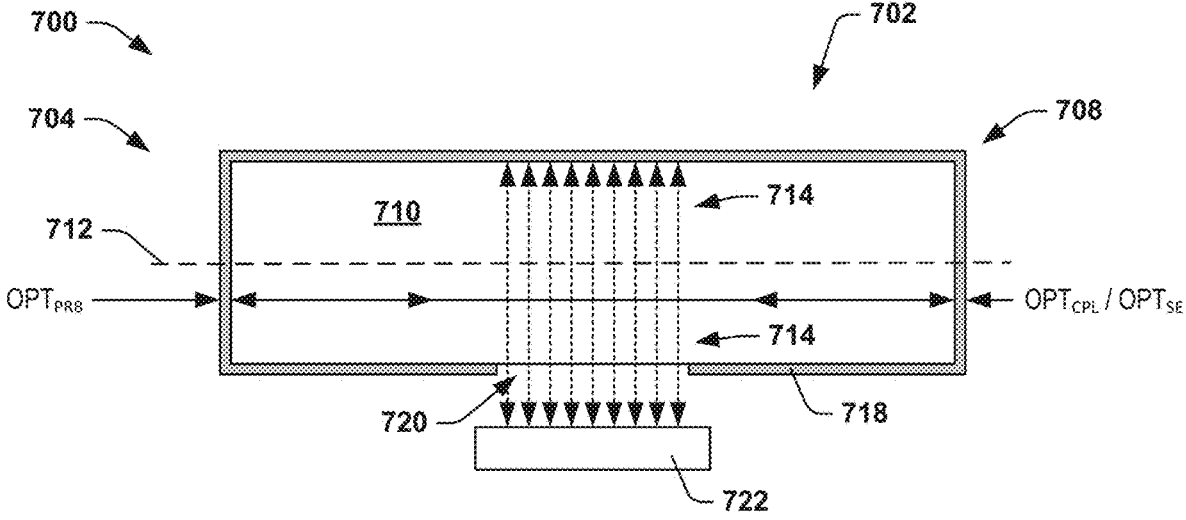
FIG. 7 illustrates an example diagram of a sensor cell detection system.
Figure 7:
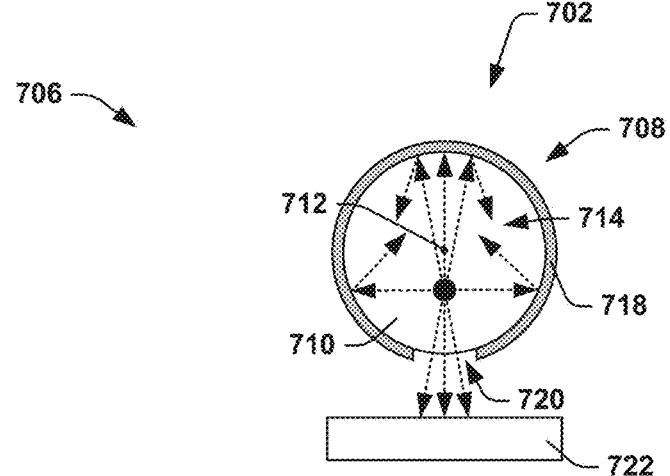

FIG. 7 illustrates an example diagram 700 of a sensor cell detection system 702. The sensor cell detection system 702 is demonstrated in a first view 704 and in a second view 706 corresponding to respective cross-sectional views demonstrated in the example of FIG. 6. The sensor cell detection system 702 can correspond to the sensor cell 202 and the photodetector 214 of the detection system 212 in the example of FIG. 2. The sensor cell detection system 702 includes a sensor cell 708 that can correspond to the sensor cell 202 in the example of FIG. 2 and the sensor cell 602 in the example of FIG. 6. Therefore, reference is to be made to the examples of FIGS. 2 and 6 in the following description of the example of FIG. 7.

The sensor cell 708 includes a transparent enclosure 710 that can be formed from a variety of transparent materials (e.g., glass). In the example of FIG. 7, the transparent enclosure 710 is arranged as a cylindrical tube having a circular cross-section relative to a central longitudinal axis 712. As described above in the examples of FIGS. 2, 4, and 5, the alkali metal atoms can be stimulated (e.g., from a ground state to the Rydberg energy state) by the probe beam $OPT_{PRB}$ and the coupling beam $OPT_{CPL}$ that are provided through the sensor cell 708, and can emit the fluorescent detection light $OPT_{FL}$, demonstrated in the example of FIG. 7 at 714, in response to the stimulated emission optical beam $OPT_{SE}$. In the example of FIG. 7, the probe beam $OPT_{PRB}$, the coupling beam $OPT_{CPL}$, and the stimulated emission optical beam $OPT_{SE}$ are provided through the sensor cell 708 parallel to and offset from the central longitudinal axis 712. As a result, the alkali metal in the sensor cell 708 can be excited from the ground state to the Rydberg energy state. The fluorescent detection light 714 can thus be emitted based on a decay of the energy of the alkali metal atoms from the decay energy state to the ground state.

In the example of FIG. 7, the sensor cell 708 includes a reflective coating 718 that surrounds the transparent enclosure 710. As an example, the reflective coating 718 can be formed from a dielectric material that can be substantially transparent with respect to the frequency of the probe beam $OPT_{PRB}$, the coupling beam $OPT_{CPL}$, and the stimulated emission optical beam $OPT_{SE}$, but highly reflective with respect to the fluorescent detection light 714. The reflective coating 718 can thus provide a highly reflective interior surface in contact with an outer surface of the transparent enclosure 710. As a result of the highly reflective interior surface of the reflective coating 718, the fluorescent detection light 714 resulting from the energy decay of the alkali metal atoms can be reflected within the sensor cell 708, as opposed to being transmissive through the transparent walls of the transparent enclosure 710.

The sensor cell 708 further includes a detection window 720 corresponding to an absence of the reflective coating 718 from a portion of the transparent enclosure 710. Therefore, the detection window 720 corresponds to an aperture through which the fluorescent detection light 714 can propagate through the transparent enclosure 710 to escape the sensor cell 708. In the example of FIG. 7, the sensor cell detection system 702 further includes a photodetector (e.g., photodiode) 722, such as corresponding to the photodetector 214, that is arranged proximal to the detection window 720 to receive the fluorescent detection light 714.

Based on the reflection of the fluorescent detection light 714 in the interior of the sensor cell 708 via the reflective coating 718, both the direct rays of the fluorescent detection light 714 and the reflected rays of the fluorescent detection light 714 can be emitted from the detection window 720. Additionally, in the example of FIGS. 6 and 7, the transparent enclosure 710 is arranged as a cylindrical tube having a round (e.g., circular) cross-section relative to the central longitudinal axis 712. Therefore, the stimulated emission optical beam $OPT_{SE}$ can be arranged to be provided offset from and parallel to the central longitudinal axis 712. As a result, as demonstrated in greater detail in the second view 706 at 724, the rays of the fluorescent detection light 714 are not retroreflected within the sensor cell 708, but instead continue to be reflected in the sensor cell 708 until they are emitted from the detection window 720. Accordingly, substantially all of the fluorescent detection light 714 that is emitted from the alkali metal atoms (e.g., along a longitudinal length of the detection window 720) can be emitted from the detection window 720 and monitored by the photodetector 722.

In view of the foregoing structural and functional features described above, a methodology in accordance with various aspects of the disclosure will be better appreciated with reference to FIG. 8. It is to be understood and appreciated that the method of FIG. 8 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 8 illustrates an example of a method 800 for detecting an external signal (e.g., the external signal $RF_{EXT}$) via an electrometer system (e.g., the electrometer system 100). At 802, a probe beam (e.g., the probe beam $OPT_{PRB}$) is provided through a sensor cell (e.g., the sensor cell 102) comprising alkali metal atoms. At 804, a coupling beam (e.g., the probe beam $OPT_{CPL}$) is provided through the sensor cell to excite the alkali metal atoms from a ground state to a Rydberg energy state of the alkali metal atoms based on the probe beam and the coupling beam. At 806, a stimulated emission optical beam (e.g., the probe beam $OPT_{SE}$) through the sensor cell to provide energy decay of the alkali metal atoms to a decay energy state that is less than the Rydberg energy state. At 808, fluorescent detection light emitted from the alkali metal atoms is monitored as the alkali metal atoms decay from the decay energy state to the ground state to determine signal characteristics of an external signal based on an intensity of the fluorescent detection light.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An electrometer system comprising:
a sensor cell comprising alkali metal atoms within;
an excitation beam system configured to provide at least one excitation optical beam through the sensor cell to excite the alkali metal atoms from a ground state to a Rydberg energy state;
a stimulated emission beam system configured to provide a stimulated emission optical beam through the sensor cell to provide energy decay of the alkali metal atoms to a decay energy state that is less than the Rydberg energy state; and
a detection system configured to monitor fluorescent detection light emitted from the alkali metal atoms as the alkali metal atoms decay from the decay energy state to the ground state to determine a measurable parameter of an external electric field based on an intensity of the fluorescent detection light.

2. The system of claim 1, wherein the excitation beam system comprises:
a probe laser configured to generate a probe beam directed through the sensor cell to excite the alkali metal atoms from the ground state to an intermediate energy state; and
at least one coupling laser configured to generate a respective at least one coupling beam directed through the sensor cell to excite the alkali metal atoms from the intermediate energy state to the Rydberg energy state.

3. The system of claim 2, wherein the probe beam is directed through the sensor cell in a first direction, and wherein the at least one coupling beam is directed through the sensor cell collinearly and anti-parallel with the probe beam.

4. The system of claim 2, wherein the decay energy state is a different energy state than the intermediate energy state.

5. The system of claim 2, wherein the stimulated emission beam system comprises a stimulated emission laser configured to generate the stimulated emission optical beam having a frequency that is tuned to an energy difference between the decay energy state and the Rydberg energy state.

6. The system of claim 2, wherein the probe beam is configured to excite the alkali metal atoms from the ground state to a first intermediate energy state, wherein the at least one coupling laser comprises:

a first coupling laser configured to generate a respective first coupling beam directed through the sensor cell to excite the alkali metal atoms from the first intermediate energy state to a second intermediate energy state;

a second coupling laser configured to generate a respective second coupling beam directed through the sensor cell to excite the alkali metal atoms from the second intermediate energy state to the Rydberg energy state;

wherein the stimulated emission beam system is configured to provide the stimulated emission optical beam through the sensor cell to provide energy decay of the alkali metal atoms from the second intermediate energy state to the decay energy state that is less than the second intermediate energy state.

7. The system of claim 1, wherein the detection system is arranged proximal to a sidewall of the sensor cell in a location that is laterally offset from a propagation direction of the stimulated emission optical beam.

8. The system of claim 1, wherein the sensor cell comprises:

a transparent enclosure; and a reflective coating that is provided on an exterior surface of the transparent enclosure to surround the sensor cell to provide a reflective interior surface in contact with the transparent enclosure of the sensor cell to reflect the fluorescent detection light, the reflective coating comprising a detection window configured to facilitate escape of the fluorescent detection light from the sensor cell for optical detection by the detection system.

9. The system of claim 8, wherein the reflective coating is formed from a dielectric material that is selected to be transparent to a frequency of the at least one excitation optical beam and the stimulated emission optical beam.

10. The system of claim 8, wherein the transparent enclosure of the sensor cell is arranged as a cylindrical tube having an approximately circular cross-section with respect to a longitudinal central axis, wherein the stimulated emission optical beam is provided through the sensor cell parallel and radially offset from the longitudinal central axis.

11. The system of claim 1, wherein the measurable parameter of the external electric field is frequency.

12. The system of claim 1, wherein the measurable parameter of the external electric field is direction.

13. A method for detecting an external signal via an electrometer system, the method comprising:

providing a probe beam through a sensor cell comprising alkali metal atoms;

providing a coupling beam through the sensor cell to excite the alkali metal atoms from a ground state to a Rydberg energy state of the alkali metal atoms based on the probe beam and the coupling beam;

providing a stimulated emission optical beam through the sensor cell to provide energy decay of the alkali metal atoms to a decay energy state that is less than the Rydberg energy state; and monitoring fluorescent detection light emitted from the alkali metal atoms as the alkali metal atoms decay from the decay energy state to the ground state to determine a measurable parameter of an external electric field based on an intensity of the fluorescent detection light.

14. The method of claim 13, wherein providing the probe beam comprises directing the probe beam through the sensor cell to excite the alkali metal atoms from the ground state to an intermediate energy state, wherein providing the coupling beam comprises directing the coupling beam to excite the alkali metal atoms from the intermediate energy state to the Rydberg energy state, wherein providing the stimulated emission optical beam comprises providing the stimulated emission optical beam to provide the energy decay of the alkali metal atoms to the decay energy state that is a different energy state than the intermediate energy state.

15. The method of claim 13, wherein monitoring the fluorescent detection light comprises monitoring the fluorescent detection light via a photodetector arranged proximal to a sidewall of the sensor cell in a location that is laterally offset from a propagation direction of the stimulated emission optical beam.

16. The method of claim 13, wherein the sensor cell comprises:

a transparent enclosure arranged as a cylindrical tube having an approximately circular cross-section with respect to a longitudinal central axis; and a reflective coating that is provided on an exterior surface of the transparent enclosure to surround the sensor cell to provide a reflective interior surface in contact with the transparent enclosure of the sensor cell to reflect the fluorescent detection light, the reflective coating comprising a detection window configured to facilitate escape of the fluorescent detection light from the sensor cell for optical detection by the detection system.

17. The method of claim 16, wherein providing the stimulated emission optical beam comprises providing the stimulated emission optical beam through the sensor cell parallel and radially offset from the longitudinal central axis.

18. An electrometer system comprising:

a sensor cell comprising alkali metal atoms within, the sensor cell comprising:

a transparent enclosure; and a reflective coating that is provided on an exterior surface of the transparent enclosure to surround the sensor cell to provide a reflective interior surface in contact with the transparent enclosure of the sensor cell, the reflective coating comprising a detection window configured to facilitate escape of fluorescent detection light from the sensor cell; and an excitation beam system configured to provide at least one excitation optical beam through the sensor cell to excite the alkali metal atoms from a ground state to a Rydberg energy state;

a stimulated emission beam system configured to provide a stimulated emission optical beam through the sensor cell to provide energy decay of the alkali metal atoms to a decay energy state that is less than the Rydberg energy state; and a detection system configured to monitor the fluorescent detection light emitted from the alkali metal atoms and reflecting from the reflective interior surface within the sensor cell via the detection window as the alkali metal atoms decay from the decay energy state to the ground state to determine signal characteristics of an external signal based on an intensity of the fluorescent detection light.

19. The system of claim 18, wherein the excitation beam system comprises:

a probe laser configured to generate a probe beam directed through the sensor cell to excite the alkali metal atoms from the ground state to an intermediate energy state; and at least one coupling laser configured to generate a respective at least one coupling beam directed through the sensor cell to excite the alkali metal atoms from the intermediate energy state to the Rydberg energy state.

20. The system of claim 19, wherein the decay energy state is a different energy state than the intermediate energy state.

21. The system of claim 18, wherein the reflective coating is formed from a dielectric material that is selected to be transparent to a frequency of the at least one excitation optical beam and the stimulated emission optical beam.

22. The system of claim 18, wherein the transparent enclosure of the sensor cell is arranged as a cylindrical tube having an approximately circular cross-section with respect to a longitudinal central axis, wherein the stimulated emission optical beam is provided through the sensor cell parallel and radially offset from the longitudinal central axis.

\* \* \* \* \*